United States Patent [19]

Grosman et al.

[11] Patent Number: 5,078,847
[45] Date of Patent: Jan. 7, 1992

[54] ION PLATING METHOD AND APPARATUS

[76] Inventors: Jerry Grosman, 2616 S. Burke, Pasadena, Tex. 77502; Wm. H. Haden, Jr., 717 Crenshaw Rd., Pasadena, Tex. 77504

[21] Appl. No.: 574,061

[22] Filed: Aug. 29, 1990

[51] Int. Cl.$^5$ .............................................. C23C 14/32
[52] U.S. Cl. ........................... 204/192.31; 204/298.05
[58] Field of Search ....................... 204/192.31, 298.05

[56] References Cited

U.S. PATENT DOCUMENTS

| | | | |
|---|---|---|---|
| 3,329,601 | 7/1967 | Mattox | 204/298.05 |
| 4,170,662 | 10/1979 | Weiss et al. | 427/38 |
| 4,250,009 | 2/1981 | Cuomo et al. | 204/192.11 |
| 4,342,631 | 8/1982 | White et al. | 204/192.31 |

Primary Examiner—Aaron Weisstuch
Attorney, Agent, or Firm—Kenneth A. Roddy

[57] ABSTRACT

An ion plating process wherein a substrate to be plated is suspended in a vacuum chamber filled with an inert gas and radio frequency is supplied to the substrate to be plated to create a plasma which is maintained by the inert gas. Positive DC voltage is then applied to the substrate and negative DC voltage to the filament. Power is then applied to the filament, and upon vaporization of the ion source a plasma of evaporated and ionized deposition material is created between the ion source and the substrate to optimize the deposition of metal plating materials and dielectric materials. The ion source, or vaporizing material is wrapped around a filament which is enclosed within the vacuum chamber. One side of the filament is connected to ground and the vaccum chamber is also ground. The RF power supply feeding power to the substrate is connected to ground and to one side of the wrapped filament and ion source. The DC voltage supply has its positive terminal connected to the RF power line feeding the substrate and its negative terminal joined to the RF power line which is connected to one side of the filament and grounded. Wire mesh grids may be placed between the high temperature ion source and the substrate for more complete control of the plasma, and to direct the plasma flow to certain locations on or around the substrate to be plated. A voltage source may be connected to the grid to control plating on certain parts of the substrate.

20 Claims, 1 Drawing Sheet

ION PLATING METHOD AND APPARATUS

BACKGROUND OF THE INVENTION

1. Field of the Invention

This invention relates generally to metal ion plating and metalizing and more particularly to a metalizing or ion plating process utilizing a vacuum chamber filled with an inert gas and a combination of RF power and positive DC voltage applied to a substrate to be plated and a combination of RF power and negative DC voltage applied to the ion source in the inert gas under vacuum to optimize the deposition of metal plating materials and dielectric materials.

2. Brief Description of the Prior Art

A process known as "sputtering" is known in the art wherein a starting material (material to be deposited), usually a metal, is arranged within an evacuated chamber in spaced relation to a receiving substrate (the object to be coated). Typically, the substrate is arranged on a grounded electrode, and the chamber is back-filled with a gas at low pressure. The material to be deposited is positioned on a conductive electrode to which a source of potential is applied. The potential source serves both to produce a gas plasma between the spaced electrodes, and to cause gas ions from the plasma to bombard the surface of the starting material (material to be deposited). Such ion bombardment acts to break or knock off atoms or molecules of the starting material, causing them to fly ion all directions. Some of these atoms or molecules of the starting material settle on the substrate and form a layer.

In the process known as "ion plating", a conductive starting material (material to be deposited), usually a metal, is placed within an evacuated chamber in spaced relation to a conductive receiving substrate (the object to be coated). A high voltage DC field is produced between the starting material and the substrate, and the chamber is then back-filled with a gas to a pressure to generate and sustain a plasma discharge. The starting material is then vaporized to form a vapor deposit of the starting material on the substrate. In the presence of the plasma, a portion of the vaporized starting material becomes ionized, and the positively charged evaporant ions and positively charged gas ions are accelerated by the electric field and bombard the substrate surface to densify the vapor deposited coating.

White, U.S. Pat. No. Re. 30,401 (reissue of U.S. Pat. No. 4,039,416), discloses a gasless ion plating process wherein plating material is melted, vaporized and then subjected to an ionization environment in a low pressure chamber with a "virtual cathode" consisting of a plasma of ionized atoms of evaporant material created by evaporating in an RF field. White teaches applying a positive DC voltage to the evaporative metal and applying a negative voltage to the object to be plated. When the plasma is generated it flows everywhere in the tank and when the DC source is applied, it has the effect of stopping plasma around the object to be plated. Very little plating action takes place out of the line-of-sight.

White, U.S. Pat. No. 4,420,386 discloses a method for ion plating using magnetic fields wherein plating material is vaporized and subjected to an ionization environment in a low pressure chamber. An electron saturated magnetic field is placed adjacent the substrate for positive ionization of the evaporant atoms of the vaporized plating material. A negative bias is applied to the substrate for attracting positive ions of the vaporized plating material.

White et al, U.S. Pat. No. 4,342,631 discloses a gasless ion plating process and apparatus which eliminates the need for electrically isolating the substrate from the evacuated chamber. A positive DC bias is developed on the plating source relative to the substrates by applying a DC positive voltage to the plating source to create an electrical field between the source and substrates for accelerating the plating ions towards the substrates for plating the same.

Weiss et al, U.S. Pat. No. 4,170,662 discloses a plasma plating method for forming a dense layer of non-conductive material on a substrate wherein the starting material is vapor deposited on the substrate while simultaneously bombarding the substrate with ions of a gas. An RF field is established between the substrate and an opposing electrode structure to produce a plasma of the gas in the vicinity of the substrate. A negative bias is created in the electrode connected to the substrate to render the electrode attractive to the positively charge ions in the plasma.

Cuomo et al, U.S. Pat. No. 4,250,009 discloses a particle beam deposition system wherein an energetic particle beam is accelerated toward a starting material located at an angle relative to the path of the beam to form both positive and negative ions. The voltage difference between the target and substrate can be adjusted to be positive or negative so that either positive or negative ions can be accelerated to the substrate.

Mattox, U.S. Pat. No. 3,329,601 discloses a method and apparatus for coating a substrate from plasma of ionized coating material wherein the starting material is connected to a filament within an evacuated chamber in spaced relation to a receiving substrate, and a high voltage DC field (generally 1000 volts or more) is produced between the starting material and the substrate, and the chamber is filled with a gas to a pressure to generate and sustain a plasma discharge. The starting material is then vaporized to form a vapor deposit of the starting material on the substrate. The substrate is connected to the negative terminal of the high voltage DC source and the filament and starting material to be vaporized is connected to the positive terminal of the high voltage DC source.

The present invention is distinguished over the prior art in general, and these patents in particular by the present process wherein the substrate to be plated is suspended in a vacuum chamber filled with an inert gas and radio frequency is supplied to the substrate to be plated to create a plasma which is maintained by the inert gas. Positive DC voltage is then applied to the substrate and negative DC voltage to the filament. Power is then applied to the filament, and upon vaporization of the ion source a plasma of evaporated and ionized deposition material is created between the ion source and the substrate to optimize the deposition of metal plating materials and dielectric materials. The ion source, or vaporizing material is wrapped around a filament which is enclosed within the vacuum chamber. One side of the filament is connected to ground and the vacuum chamber is also grounded. The RF power supply feeding power to the substrate is connected to ground and to one side of the wrapped filament and ion source. The DC voltage supply has its positive terminal connected to the RF power line feeding the substrate and its negative terminal joined to the RF power line which is connected to one side of the filament and grounded. Wire mesh grids may be placed between the high temperature ion source and the substrate for more complete control of the plasma, and to direct the plasma flow to certain locations on or around the substrate to be plated. A voltage source may be connected to the grid to control plating on certain parts of the substrate.

SUMMARY OF THE INVENTION

It is therefore an object of the present invention to provide an improved metalizing or metal plating process.

It is another object of this invention to provide a metalizing or metal plating process which will result in improved adhesion of the plating material.

Another object of this invention is to provide a metalizing or metal plating process which is particularly useful in plating irregular shapes.

Another object of this invention is to provide a metalizing or metal plating process which will result in improved adhesion of plating material on non-conductive objects.

A further object of this invention is to provide a metalizing or metal plating process which will allow heavy thick coats of the plating material to be built up on plated objects without excessive build up of substrate heat.

A still further object of this invention is to provide a metalizing or metal plating process which is simple and reliable in operation and economical to manufacture.

Other objects of the invention will become apparent from time to time throughout the specification and claims as hereinafter related.

The above noted objects and other objects of the invention are accomplished by an ion plating process wherein a substrate to be plated is suspended in a vacuum chamber filled with an inert gas and radio frequency is supplied to the substrate to be plated to create a plasma which is maintained by the inert gas. Positive DC voltage is then applied to the substrate and negative DC voltage to the filament. Power is then applied to the filament, and upon vaporization of the ion source a plasma of evaporated and ionized deposition material is created between the ion source and the substrate to optimize the deposition of metal plating materials and dielectric materials. The ion source, or vaporizing material is wrapped around a filament which is enclosed within the vacuum chamber. One side of the filament is connected to ground and the vacuum chamber is also grounded. The RF power supply feeding power to the substrate is connected to ground and to one side of the wrapped filament and ion source. The DC voltage supply has its positive terminal connected to the RF power line feeding the substrate and its negative terminal joined to the RF power line which is connected to one side of the filament and grounded. Wire mesh grids may be placed between the high temperature ion source and the substrate for more complete control of the plasma, and to direct the plasma flow to certain locations on or around the substrate to be plated. A voltage source may be connected to the grid to control plating on certain parts of the substrate.

DESCRIPTION OF THE PREFERRED EMBODIMENT

Figure 1:
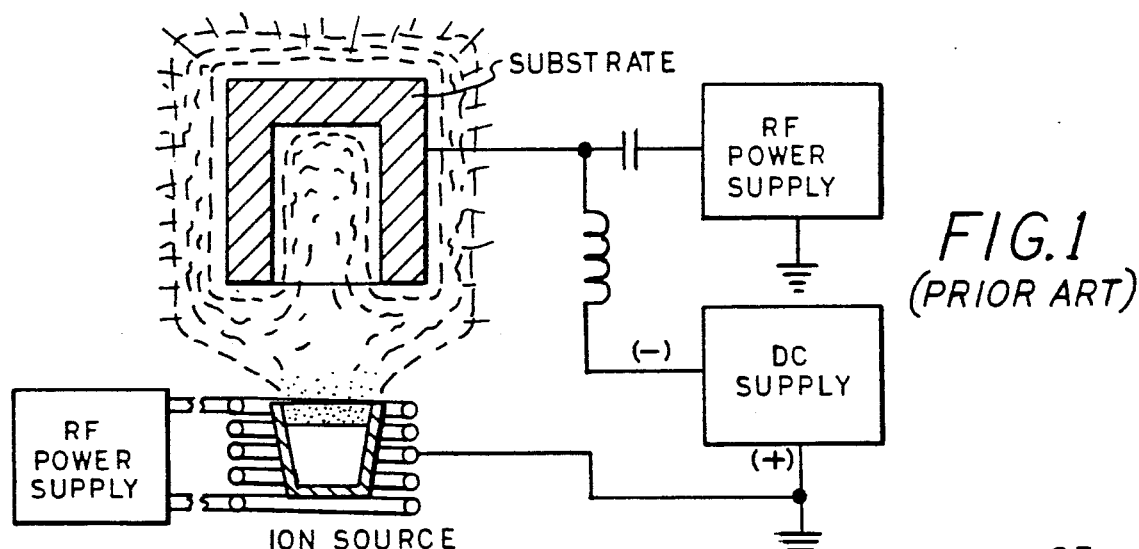
FIG. 1 is a schematic diagram of illustrating a prior art ion plating process.

Referring to the drawings by numerals of reference, there is shown in FIG. 1, a gasless ion plating system of the prior art which also utilizes radio frequency power and vaporization in a vacuum. In the prior art, radio frequency power is supplied to the ion source to create a plasma of evaporated and ionized plating material. If the material to be plated (substrate) is an insulator, the well known DC self-bias effect that occurs when an insulator is placed in a radio frequency field causes a negative self-bias to occur on the surface of the substrate. When plating a conductive substrate, a negative bias is induced on the substrate from an external source. This is done by connecting the negative terminal of a DC source coupled with one RF power supply to the substrate and the positive terminal of the DC source coupled with another RF power supply to the ion source. In typical plating operations, the RF power to the ion source is suggested to be at a frequency of 10 to 800 kilohertz, and RF power to the substrate be at a frequency of 2 to 40 megahertz. The ion source vaporizes plating material that then forms an ionized plasma due to the action of the RF field.

Figure 2:
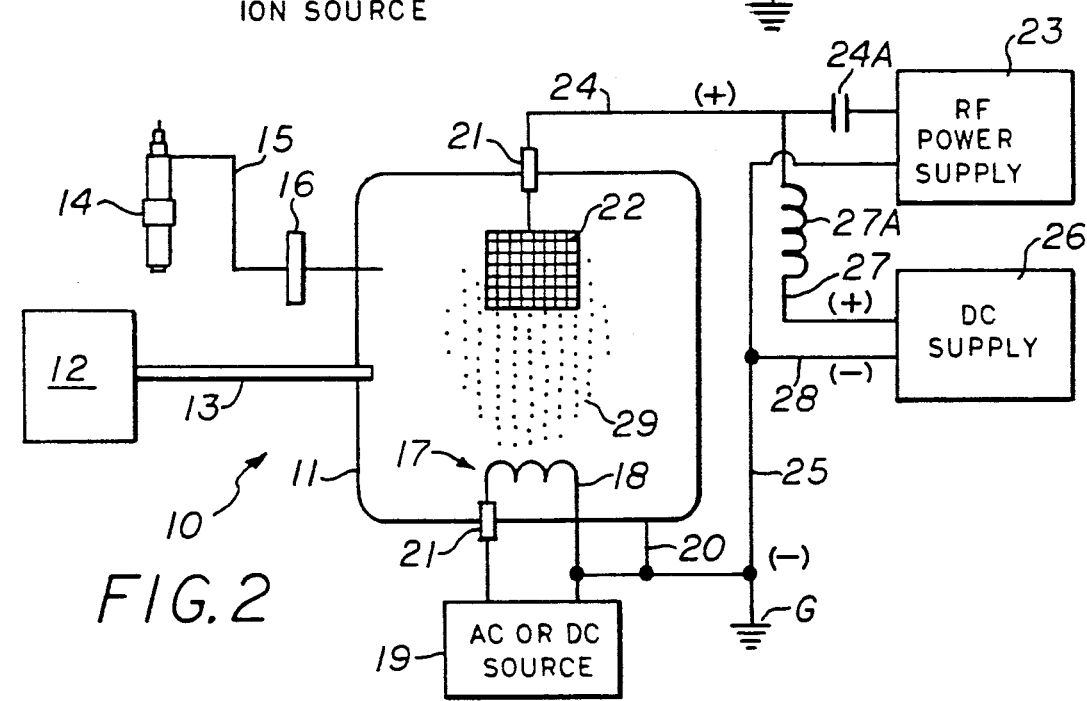
FIG. 2 is a schematic diagram of the metalizing or ion plating process of the present invention.

FIG. 2 illustrates the ion plating process and apparatus 10 of the present invention somewhat schematically. An enclosure or vacuum chamber 11 is connected to an evacuation pump 12 by evacuation line 13 and a conventional control valve (not shown) may be installed in the line 13. A source of gas 14 is connected to the chamber 11 by gas supply line 15 having a metering control valve 16 for feeding a gas into the chamber from the source 14. The ion source 17, or vaporizing material is wrapped around a filament 18 and the wrapped filament is enclosed within the vacuum chamber 11. The vaporizing material may also be placed on, or adjacent to the filament. Preferred vaporizing materials are suggested to be aluminum, copper, gold, platinum, silver, or titanium; however, other conventional vaporizing materials may be used.

The wrapped filament 18 or multiple filaments (depending upon the application) are connected to a filament AC or DC electrical power supply 19. One side of the filament 18 (either side) is connected to ground G. The vacuum chamber 11 may also be connected to ground G by lead 20. One filament lead is grounded and the other is insulated from the chamber 11 by passing it through insulator 21. The substrate items 22, to be ion plated are suspended within the chamber 11 and insulated from the chamber by insulators 21.

A radio frequency (RF) power supply 23 feeds power through line 24 to the substrate 22 to be plated. The RF power supply 23 is also connected through line 25 to ground G and to one side of the wrapped filament 18 and ion source 17.

A direct current (DC) voltage supply 26 has its positive terminal (+) connected by lead 27 to the RF power line 24 which is connected to the substrate 22 to be plated. To prevent the RF power from shorting out the DC power, a capacitor 24A is installed in the line 24 and an RF choke coil 27A is installed in the line 27, or other conventional electronic means may be utilized to prevent shorting. The negative terminal (−) of the DC voltage supply 26 is joined by lead 28 to the RF power line 25 which is connected to one side of the filament 18 and grounded. Thus, a combination of RF power and positive DC voltage is applied to the substrate 22 to be ion plated, and a combination of RF power and negative DC voltage is applied to the ion source 17 (vaporizing material).

OPERATION

In operation, the substrate 22 to be ion plated is suspended in the chamber 11. The substrate 22 must be clean for proper adhesion. The system is then evacuated through evacuation line 13 by pulling a vacuum of around $4 \times 10^{-4}$ Torr on the chamber 11 by vacuum pump 12. When the proper vacuum is attained, an inert gas, such as Argon, is metered into the chamber 11 from supply 14 through valve 16

After the vacuum is stabilized at approximately $4 \times 10^{-6}$ Torr, radio frequency RF power is supplied to the substrate 22 to be plated from RF supply 23 to create a plasma 29 between the substrate and the ion source. The inert gas maintains the plasma.

Positive DC voltage is then applied to the substrate 22 and negative DC voltage is applied to the filament 18. After the plasma field has stabilized with DC on it, the filament power is applied to the filament 18 by the AC or DC filament electrical power supply 19 and the filament is gradually brought up to melting temperature, and upon vaporization of the ion source 17 a plasma of evaporated and ionized deposition material is created between the ion source 17 and the substrate 22.

It should be noted, that with the present invention, a positive charge is used on the substrate 22 to attract the vaporized material rather than negative as used in conventional sputtering, and negative voltage is used on the ion source, rather than positive. The plasma provides the medium by which atoms are moved and the positive voltage provides the attraction. The plasma field is controlled with the DC source 26. Almost no plating takes place out of the plasma field therefore little vaporized material is wasted. A voltage up to 400 volts may be used with the limiting factor being a short circuit of a conductive flow path with the plasma.

The plasma tends to follow the geometry of the positively charged substrate 22. The quality of the plasma allows for full three-dimensional coverage for irregular surfaces, including the inside of small diameter holes.

In a typical plating operation, RF power supply 23 may be operated at a frequency of 13.56 kilohertz, however, the frequency may be adjustably varied for specific applications as long as the plasma is present to assist in the conductive path.

With present system, the combination of RF power and positive DC voltage applied to the substrate and a combination of RF power and negative DC voltage applied to the ion source in the inert gas under vacuum helps optimize the deposition of metal plating materials and dielectric materials. A wide variety of conductive and nonconductive materials can be plated, including ceramic, Teflon (polytetrafluoroethylene) Bakelite, and some plastics materials. The process known as back sputtering is not necessary in this process and preheating of substrate is not required.

Figure 3:
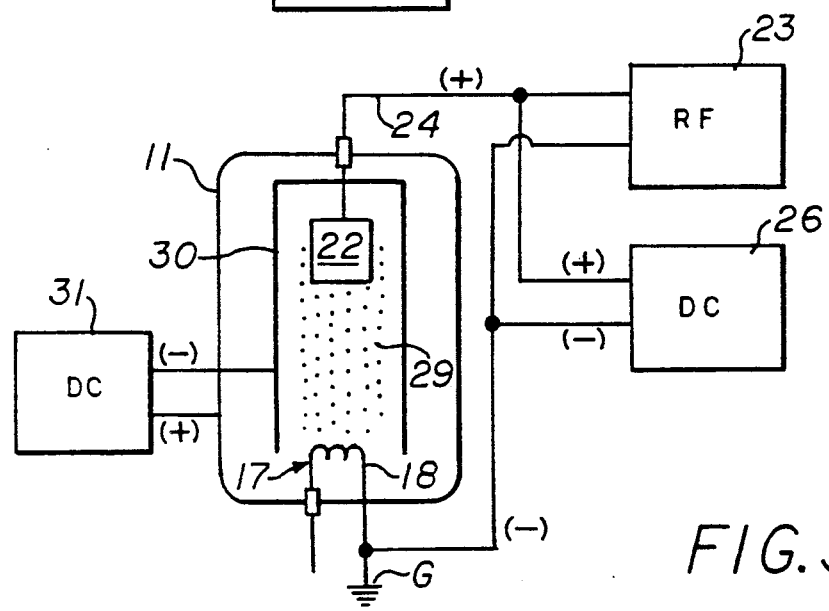
FIG. 3 is a schematic diagram of a modification of the metalizing or ion plating process of the present invention utilizing grids or shields.

As shown in FIG. 3, a wire mesh grid 30 may be placed between the high temperature ion source and the substrate for more complete control of the plasma, and to direct the plasma flow to certain locations on the substrate to be plated. Although not necessary, grids may or may not have a DC voltage source 31 applied depending on the part of substrate to be plated, with negative connected to the grid and positive to the chamber 11. Although a slight negative voltage is used to suppress the plasma field, the more negative the voltage, the greater the suppression of the plasma field. The grids may also be used to suppress plating around plated objects.

Nonconductive objects may be plated by placing the object within the plasma field and allowing a conductive path. For example, the nonconductive object may be placed on a conductive metal plate connected to the RF and DC line 24. Plating takes place close to the metal plate to begin with and gradually forms around the nonconductive object. A metallic conductive coat is formed around the nonconductive material. Thicker coats are then added or accomplished with sustained plating or by subsequent vaporization of metal. This may be accomplished with more filaments that are heated up separately in sequence, or with a single filament with metal reapplied by several processes.

Alloys may also be formed on material to be plated by vaporizing different metals at different times within the plasma field and allowing plating to take place concurrently.

While this invention has been described fully and completely with special emphasis upon a preferred embodiment, it should be understood that within the scope of the appended claims the invention may be practiced otherwise than as specifically described herein.

We claim:

1. A process for ion plating a substrate supported within a chamber with a plating material, comprising the steps of;
    placing a plating material to be vaporized and a substrate to be plated in said chamber in spaced relation,
    said plating material being an ion source,
    evacuating said chamber,
    introducing an inert gas into said chamber,
    applying a radio frequency field from a radio frequency source to said substrate to be plated to form a plasma between said substrate and said ion source,
    developing a DC positive bias on said substrate,
    developing a DC negative bias on said plating material to be vaporized within said chamber relative to said substrate, and then
    vaporizing said plating material in said chamber to create a plasma of evaporated and ionized deposition material between the vaporized plating material said substrate.

2. The process according to claim 1 wherein
    said substrate is conductive, and
    said step of developing a DC positive bias on said substrate comprises the application of a DC positive bias source to said substrate.

3. The process according to claim 1 wherein
    said substrate is nonconductive, and
    said step of developing a DC positive bias on said substrate comprises
    placing the nonconductive substrate on a conductive plate, and
    applying a DC positive bias source to said plate.

4. The process according to claim 1 wherein
    said step of vaporizing plating material comprises the application of a DC voltage to said plating material.

5. The process according to claim 1 wherein said step of vaporizing plating material comprises the application of an AC voltage to said plating material.

6. The process according to claim 1 wherein said radio frequency field applied within said chamber is at a frequency within the range of approximately 2 to 40 megahertz.

7. The process according to claim 1 wherein said substrate is a material previously plated by the process of claim 1.

8. The process according to claim 1 wherein said plasma formed by the radio frequency field is maintained by said inert gas.

9. The process according to claim 1 including the steps of
positioning a plasma control member relative to said substrate and said vaporized plating material for directing said plasma field to predetermined locations relative to said substrate.

10. The process according to claim 9 including the step of
applying a DC negative bias to said plasma control member, and increasing or decreasing the negative bias to cause a corresponding increase or decrease of the plasma field.

11. A process for ion plating a substrate within a chamber with a plating material source inside of the chamber, comprising the steps of;
placing a plating material to be vaporized and a substrate to be plated in said chamber in spaced relation,
said plating material being an ion source,
evacuating said chamber,
introducing an inert gas into said chamber,
applying a RF signal to said substrate, thereby creating an RF field at the substrate,
effecting a DC positive electrical potential on said substrate relative to said plating material and other portions of the chamber by applying a DC bias to said substrate, then
vaporizing said plating material in the evacuated chamber, whereby
the RF field creates an ionized plasma from the vaporized plating material which is maintained by the inert gas between the substrate and the vaporized plating material with the ionized plating material thus accelerated onto the substrate surface as a result of the positive electrical potential for particular advantage in plating a conductive substrate.

12. Apparatus for plating a substrate with a plating material, including;
a chamber adapted to hold said substrate and said plating material,
means for evacuating said chamber,
means for introducing an inert gas into said chamber,
RF source means connected within said chamber to apply radio frequency signal power at said substrate creating an RF field between said substrate and said plating material to form a plasma therebetween,
external source means for inducing a DC positive bias on the substrate relative to the rest of the chamber and a DC negative bias on the plating material, and
means for vaporizing said plating material in the evacuated chamber.

13. The apparatus according to claim 12 particularly adapted to plate a conductive substrate wherein
the means for inducing a DC positive bias on the substrate includes a DC bias source adapted to be connected to said substrate.

14. The apparatus according to claim 12 particularly adapted to plate a nonconductive substrate including
conductive means for supporting said nonconductive substrate, wherein
the means for inducing a DC positive bias on the substrate includes a DC bias source connected to said conductive means.

15. The apparatus according to claim 12 wherein
the means for vaporizing the plating material is a filament device.

16. The apparatus according to claim 12 wherein
the means for vaporizing the plating material is a resistance heat element device.

17. The apparatus according to claim 12 including
the connection of said RF source means through a radio frequency coupling capacitance means to said substrate.

18. The apparatus according to claim 17 wherein
said means for creating a DC positive bias to the substrate includes
a direct current source having a positive terminal connection through RF choke means to said substrate, and
a negative terminal connection to a voltage potential reference source of the system.

19. The apparatus according to claim 17 including
plasma control means positioned relative to said substrate and said vaporized plating material for directing said plasma field to predetermined locations relative to said substrate.

20. The apparatus according to claim 19 including
external source means for inducing a DC negative bias to said plasma control means relative to the rest of the chamber, whereby
an increase in the negative bias will cause corresponding suppression of the plasma field.

* * * * *